(12) United States Patent
Cho

(10) Patent No.: US 9,841,916 B2
(45) Date of Patent: Dec. 12, 2017

(54) MEMORY SYSTEM FOR CONTROLLING SEMICONDUCTOR MEMORY DEVICES THROUGH PLURALITY OF CHANNELS

(71) Applicant: SK hynix Inc., Gyeonggi-do (KR)

(72) Inventor: Sung Yeob Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/957,411

(22) Filed: Dec. 2, 2015

(65) Prior Publication Data

US 2017/0003909 A1 Jan. 5, 2017

(30) Foreign Application Priority Data

Jun. 30, 2015 (KR) .................... 10-2015-0092972

(51) Int. Cl.
| | | |
|---|---|---|
| *G06F 3/06* | (2006.01) | |
| *G11C 7/10* | (2006.01) | |
| *G11C 16/10* | (2006.01) | |
| *G06F 12/08* | (2016.01) | |
| *G06F 12/0802* | (2016.01) | |

(52) U.S. Cl.
CPC ............ *G06F 3/0638* (2013.01); *G06F 3/061* (2013.01); *G06F 3/0604* (2013.01); *G06F 3/0679* (2013.01); *G06F 12/0802* (2013.01); *G11C 7/1006* (2013.01); *G11C 16/10* (2013.01); *G06F 2212/2022* (2013.01); *G06F 2212/60* (2013.01); *G06F 2212/7203* (2013.01); *G11C 2216/14* (2013.01)

(58) Field of Classification Search
CPC ...... G06F 3/0638; G06F 3/0604; G06F 3/061; G06F 3/0679; G06F 11/14; G06F 11/1402; G06F 11/1471; G06F 11/1474
See application file for complete search history.

(56) References Cited

U.S. PATENT DOCUMENTS

| | | | | |
|---|---|---|---|---|
| 7,433,141 | B2 * | 10/2008 | McAuliffe | G11B 20/1201 360/39 |
| 7,873,803 | B2 | 1/2011 | Cheng | |
| 8,996,792 | B2 * | 3/2015 | Mun | G11C 16/10 711/103 |
| 2008/0162789 | A1 * | 7/2008 | Choi | G11C 11/5628 711/103 |
| 2008/0209110 | A1 * | 8/2008 | Pyeon | G06F 13/4243 711/103 |

(Continued)

FOREIGN PATENT DOCUMENTS

KR 1020130060795 6/2013

*Primary Examiner* — Mark Giardino, Jr.
*Assistant Examiner* — Alexander Yoon
(74) *Attorney, Agent, or Firm* — IP & T Group LLP

(57) ABSTRACT

A memory system includes a plurality of channels; a plurality of semiconductor memory devices connected to the channels; and a controller that controls the semiconductor memory devices through the channels, wherein the controller writes program data in a first semiconductor memory device of the plurality of semiconductor memory devices, and wherein, when the writing of the program data fails, the program data is temporarily stored in a page buffer unit of a second semiconductor memory device of the plurality of semiconductor memory devices connected to a channel other than the channel corresponding to the first semiconductor memory device.

18 Claims, 13 Drawing Sheets

(56) References Cited

U.S. PATENT DOCUMENTS

| | | | | |
|---|---|---|---|---|
| 2010/0161849 A1* | 6/2010 | Suk | ............... | G06F 13/122 |
| | | | | 710/23 |
| 2010/0287333 A1* | 11/2010 | Lee | ............... | G06F 12/0873 |
| | | | | 711/103 |
| 2012/0246392 A1* | 9/2012 | Cheon | ............... | G06F 12/0871 |
| | | | | 711/103 |
| 2012/0265928 A1* | 10/2012 | Mun | ............... | G11C 16/10 |
| | | | | 711/103 |

* cited by examiner

MEMORY SYSTEM FOR CONTROLLING SEMICONDUCTOR MEMORY DEVICES THROUGH PLURALITY OF CHANNELS

CROSS-REFERENCE TO RELATED APPLICATIONS

The present application claims priority to Korean patent application number 10-2015-0092972, filed on Jun. 30, 2015, the entire disclosure of which is herein incorporated by reference in its entirety.

BACKGROUND

1. Field

Various embodiments of the present disclosure relate to an electronic device, and more particularly, to a memory system controlling semiconductor memory devices through a plurality of channels.

2. Discussion of Related Art

Semiconductor memory devices are implemented by using a semiconductor, such as silicon (Si), germanium (Ge), gallium arsenide (GaAs), an indium phosphide (InP). The semiconductor memory devices are generally classified into volatile memory devices and nonvolatile memory devices.

In the volatile memory devices, stored data dissipates when power is blocked. The volatile memory devices include a Static RAM (SRAM), a Dynamic RAM (DRAM), a Synchronous DRAM (SDRAM), and the like. On the other hand, the nonvolatile memory devices retain stored data even when not powered. The nonvolatile memory devices include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided into a NOR type and a NAND type.

A plurality of semiconductor memory devices may be included in a memory system. The semiconductor memory devices are controlled through a plurality of channels to be efficiently operated by a controller.

SUMMARY

Various embodiments of the present invention are directed to a memory device having improved operation speed. An embodiment of the present disclosure may include a memory system including a plurality of channels; a plurality of semiconductor memory devices connected to the channels; and a controller that controls the semiconductor memory devices through the channels, wherein the controller writes program data in a first semiconductor memory device of the plurality of semiconductor memory devices, and wherein, when the writing of the program data fails, the program data is temporarily stored in a page buffer unit of a second semiconductor memory device of the plurality of semiconductor memory devices connected to a channel other than the channel corresponding to the first semiconductor memory device.

An embodiment of the present disclosure may include a memory system including a plurality of channels; a plurality of semiconductor memory devices connected to the channels; and a controller that controls the semiconductor memory devices through the channels, and generates random data by randomizing raw data, wherein the controller writes the random data in a first semiconductor memory device of the plurality of semiconductor memory devices, and wherein, when the writing of the random data fails, the random data is de-randomized, and the de-randomized data is temporarily stored in a page buffer unit of a second semiconductor memory device of the plurality of semiconductor memory devices connected to a channel other than the channel corresponding to the first semiconductor memory device.

An embodiment of the present disclosure may include a memory system including a plurality of channels; a plurality of semiconductor memory devices connected to the channels; and a controller that controls the semiconductor memory devices through the channels, wherein the controller includes channel controllers connected to the channels, respectively, and a direct bus connecting the channel controller to each other, and each of the channel controllers commands to write data in semiconductor memory devices connected to a corresponding channel, and communicates with another channel controller through the direct bus in relation to the data when the writing of the data fails.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Hereinafter, embodiments of the present disclosure will be described with reference to the accompanying drawings in detail. In the description below, it should be noted that only a part necessary for understanding an operation according to the present disclosure will be explained, and explanation on other parts will be omitted in order not to obscure the main point of the present disclosure. However, the present disclosure is not limited to the exemplary embodiments described herein, and may be specified in other forms. However, the present exemplary embodiments are provided for describing the present disclosure in detail so that those skilled in the art may easily work the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
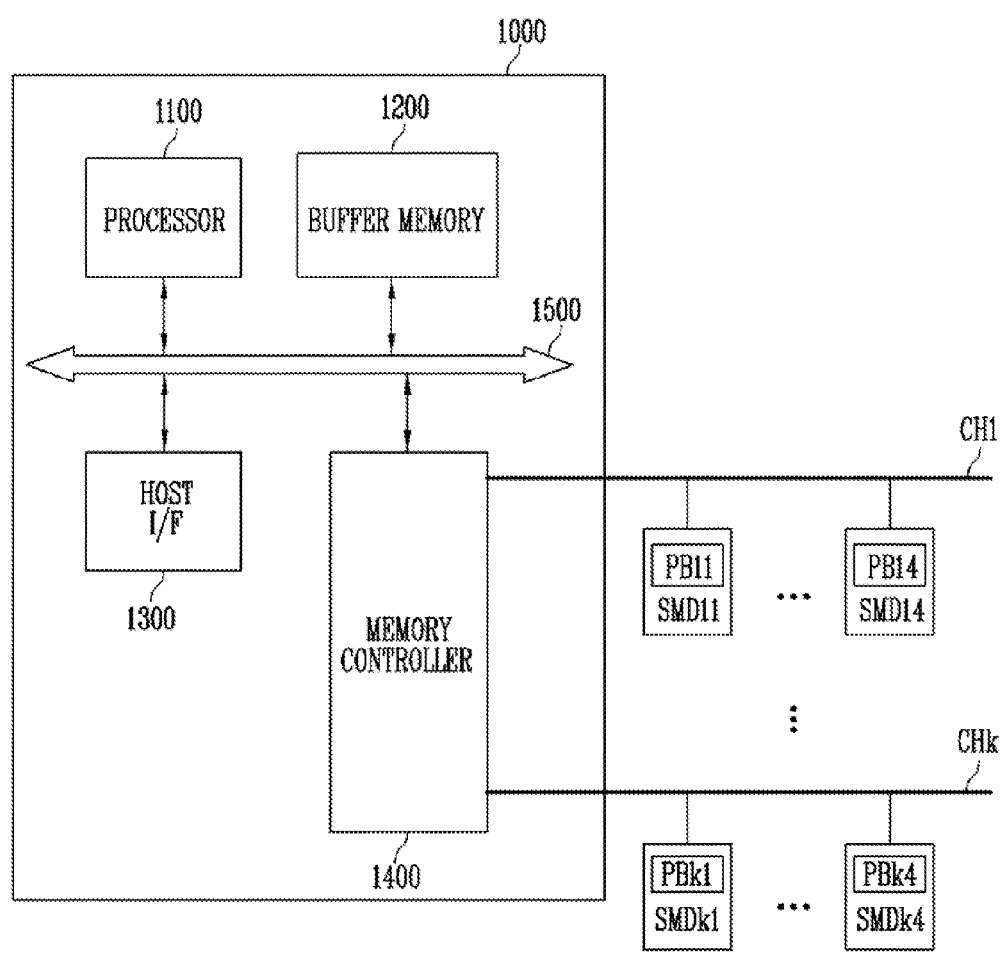
FIG. 1 is a block diagram illustrating a memory system according to an embodiment of the present disclosure.

FIG. 1 is a block diagram illustrating a memory system according to an embodiment of the present disclosure.

Referring to FIG. 1, a memory system may include a plurality of semiconductor memory devices SMD11 to SMDk4, and a controller 1000.

The semiconductor memory devices SMD11 to SMDk4 are divided into first to $k^{th}$ memory groups. For example, the first memory group includes the semiconductor memory devices SMD11 to SMD14. Further, the $k^{th}$ memory group includes the semiconductor memory devices SMDk1 to SMDk4.

The semiconductor memory devices included in a single memory group are connected with the controller 1000 through a corresponding channel. For example, the semiconductor memory devices SMD11 to SMD14 included in the first memory group are connected with the controller 1000 through a first channel CH1. Further, the semiconductor memory devices SMDk1 to SMDk4 included in the $k^{th}$ memory group are connected with the controller 1000 through a $k^{th}$ channel CHk.

Each of the semiconductor memory devices SMD11 to SMDk4 includes a page buffer unit. For example, the first to fourth semiconductor memory devices SMD11 to SMD14 connected to the first channel CH1 include first to fourth page buffer units PB11 to PB14, respectively. Further, the first to fourth semiconductor memory devices SMDk1 to SMDk4 connected to the $k^{th}$ channel CHk include first to fourth page buffer units PBk11 to PBk14, respectively.

Figure 2:
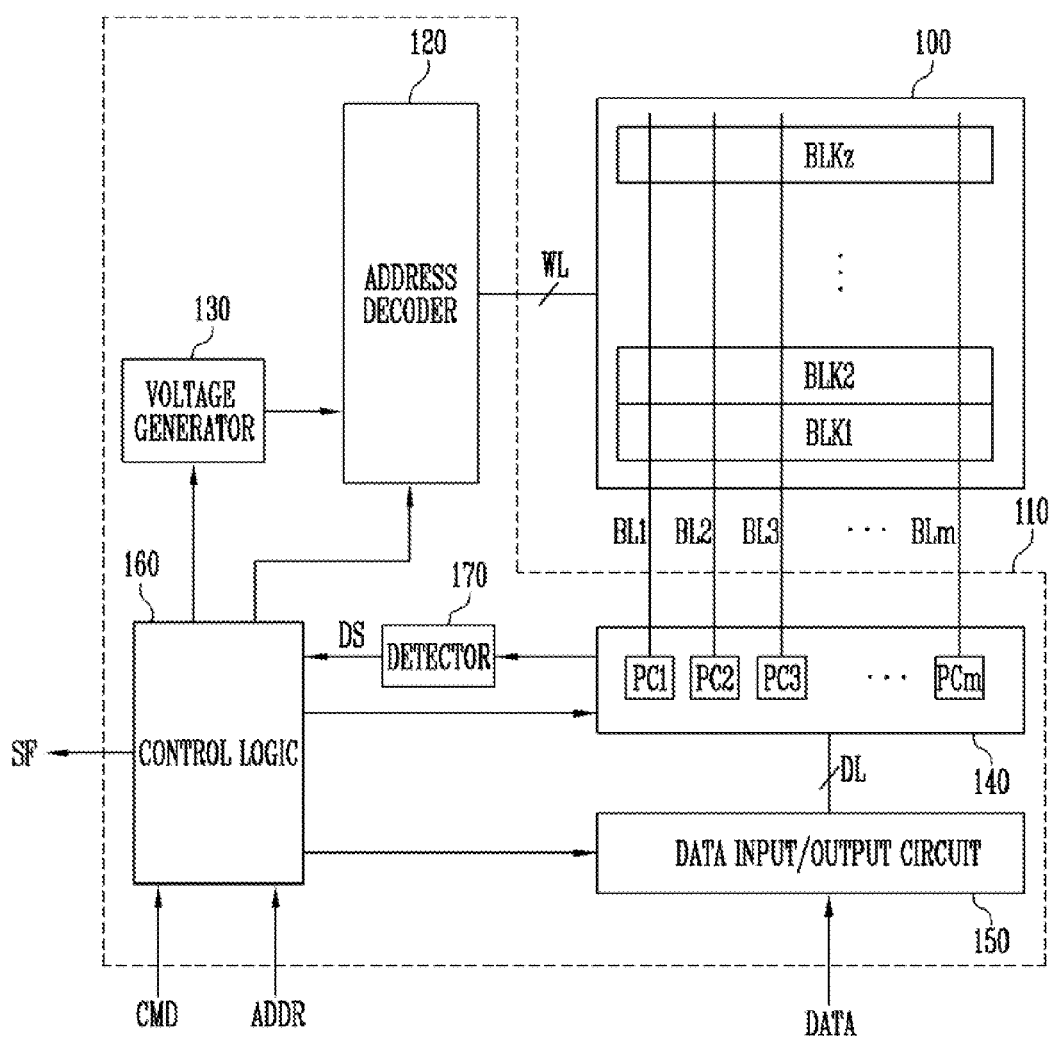
FIG. 2 is a detailed diagram of a semiconductor memory device shown in FIG. 1.

FIG. 2 is a detailed diagram illustrating a semiconductor memory device shown in FIG. 1.

Referring to FIG. 2, a semiconductor memory device 50 may include a memory cell array 100, and a peripheral circuit 110 including a page buffer unit 140.

The memory cell array 100 includes a plurality of memory blocks BLK1 to BLKz. The memory blocks BLK1 to BLKz are connected to an address decoder 120 through word lines WL, and are connected to the page buffer unit 140 through bit lines BL1 to BLm. Each of the memory blocks BLK1 to BLKz includes a plurality of pages. The pages are connected to the word lines WL, respectively. Each page includes a plurality of memory cells. The memory cells may be nonvolatile memory cells.

A program operation and a read operation of the semiconductor memory device 50 is performed in units of a page. An erase operation of the semiconductor memory device 50 is performed in units of a memory block.

The peripheral circuit 110 may include the address decoder 120, a voltage generator 130, the page buffer unit 140, a data input/output circuit 150, a control logic 160, and a detector 170.

The address decoder 120 is connected to the memory cell array 110 through the word lines WL. The address decoder 120 may be operated under the control of the control logic 160.

The address decoder 120 receives an address ADDR through the control logic 160. The program operation of the semiconductor memory device 50 is performed in the unit of the word line. During the program operation, the address ADDR may include a block address and a row address.

The address decoder 120 may decode the block address in the received address ADDR. The address decoder 120 selects one memory block among the memory blocks BLK1 to BLKz according to the decoded block address.

The address decoder 120 may decode a row address in the received address ADDR. The address decoder 120 selects one word line of the memory block selected according to the decoded row address. Accordingly, one page is selected.

The address decoder 120 may include an address buffer, a block decoder, and a row decoder.

The voltage generator 130 may generate a plurality of voltages by using an external power voltage supplied to the semiconductor memory device 50. The voltage generator 130 may be operated under the control of the control logic 160.

The voltage generator 130 may generate an internal power voltage by regulating the external power voltage. The internal power voltage generated by the voltage generator 130 is used as an operation voltage of the semiconductor memory device 50.

The page buffer unit 140 includes first to $m^{th}$ page buffer circuits PC1 to PCm. The first to $m^{th}$ page buffer circuits PC1 to PCm are connected to the memory cell array 110 through the first to $m^{th}$ bit lines BL1 to BLm, respectively. The first to $m^{th}$ page buffer circuits PC1 to PCm are connected to the data input/output circuit 150 through data lines DL. The first to $m^{th}$ page buffer circuits PC1 to PCm are operated in response to the control of the control logic 160.

During the program operation, the first to $m^{th}$ page buffer circuits PC1 to PCm receive program data DATA through the data input/output circuit 150. The first to $m^{th}$ page buffer circuits PC1 to PCm may transmit the program data DATA to a selected page through the bit lines BL1 to BLm. A memory cell connected to a bit line, to which a program permission voltage (e.g., a ground voltage) is applied may have an increased threshold voltage. A threshold voltage of a memory cell connected to the bit line, to which a program inhibition voltage (e.g., a power voltage) is applied may be maintained. During a verification of the program operation, the first to $m^{th}$ page buffer circuits PC1 to PCm read page data from the selected page through the bit lines BL1 to BLm.

The control logic 160 is connected to the address decoder 120, the voltage generator 130, the page buffer unit 140, the data input/output circuit 150, and the detector 170. The control logic 160 receives a command CMD and the address ADDR from the controller 1000. The control logic 160 may control the address decoder 120, the voltage generator 130, the page buffer unit 140, the data input/output circuit 150, and the detector 170 in response to the command CMD. The control logic 160 transmits the address ADDR to the address decoder 120.

The detector 170 is connected to the page buffer unit 140 and the control logic 160. The detector 170 is operated under the control of the control logic 160.

During the verification of the program operation, the page data read from the selected memory cells may be temporarily stored in the first to $m^{th}$ page buffer circuits PC1 to PCm. The first to $m^{th}$ page buffer circuits PC1 to PCm may generate pass/fail bits indicating whether data bits of the page data correspond to data bits of the program data DATA, respectively, under the control of the control logic 160. The pass/fail bits may indicate whether the selected memory cells reach desired voltage states and the program operation is completed. The generated pass/fail bits are transmitted to the detector 170.

The detector 170 enables a detection signal DS when the number of data bits corresponding to a program pass among the pass/fail bits is greater than the predetermined number. The detector 170 disables the detection signal DS when the number of data bits corresponding to the program pass among the pass/fail bits is less than or equal to the predetermined number.

When the detection signal DS is disabled, the control logic 160 controls the peripheral circuit 110 so that the program operation is re-performed. The program operation and the program verification may be repeatedly performed until the detection signal DS is enabled. When the program operation and the program verification configure one program loop, a plurality of program loops may be performed. The enabling of the detection signal DS indicates the completion of the program operation. The control logic 160 may output a state signal SF indicating the program operation passed. When the detection signal DS is disabled even though the predetermined number of times of the program loops is performed, the control logic 160 may output the state signal SF indicating the program operation is failed. The state signal SF may be provided to the controller 1000 through a corresponding channel.

As an exemplary embodiment, the semiconductor memory device 50 may be a flash memory device.

Referring back to FIG. 1, the controller 1000 controls the semiconductor memory devices SMD11 to SMD14, and SMDk1 to SMDk4. When the controller 1000 commands to read data, the selected semiconductor memory device performs the read operation. When the controller 1000 commands the write operation, the selected semiconductor memory device performs the program operation. When the controller 1000 commands the erase operation, the selected semiconductor memory device performs the erase operation.

The controller 1000 may include a processor 1100, a buffer memory 1200, a host interface (I/F) 1300, and a memory controller 1400.

The processor 1100 is connected to a main bus 1500. The processor 1100 may control a general operation of the controller 1000. The processor 1100 performs a function of a flash translation layer (FTL). When the processor 1100 receives a request from a host (not illustrated) through a host interface 1300, the processor 1100 may generate a physical block address corresponding to the corresponding request.

The processor 1100 may convert a logical block address included in the request into the physical block address. When the request from the host is a program request, program data may be additionally received from the host. The processor 1100 may store the physical block address, the program data, and the write command corresponding to the program request in the buffer memory 1200. The write command, the physical block address, and the program data stored in the buffer memory 1200 may be transmitted to the selected semiconductor memory device among the semiconductor memory devices SMD11 to SMD14, and SMDk1 to SMDk4 by the memory controller 1400. The selected semiconductor memory device may be specified by the physical block address. The write command is provided as the command CMD of FIG. 2. The physical block address is provided as the address ADDR of FIG. 2. The program data is provided as the program data DATA of FIG. 2.

The processor 1100 may autonomously generate the write command, the physical block address, and the program data without a request from the host, and transmit the generated write command, physical block address, and program data to a selected semiconductor memory device among the semiconductor memory devices SMD11 to SM14, and SMDk1 to SMDk4. For example, the processor 1100 may generate the write command, the physical block address, and the program data for background operations, such as a program operation for wear leveling and a program operation for garbage collection, and command to write the program data.

The buffer memory 1200 is connected to the main bus 1500. The buffer memory 1200 is operated in response to the control of the processor 1100. The buffer memory 1200 may be used as an operation memory of the processor 1100, a cache memory between the semiconductor memory devices SMD11 to SMD14, and SMDk1 to SMDk4 and the host, and/or a data buffer between the semiconductor memory devices SMD11 to SMD14, and SMDk1 to SMDk4 and the host.

The host interface 1300 includes a protocol for performing communication between the host and the controller 1000. The host interface 1300 may communicate with the host through at least one of various interface protocols, such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, and/or a private protocol.

The memory controller 1400 is connected to the main bus 1500. The memory controller 1400 is operated under the control of the processor 1100. The memory controller 1400 may control the semiconductor memory devices through the first to k$^{th}$ channels CH1 to CHk. The memory controller 1400 transmits the write command, the physical block address, and the program data stored in the buffer memory 1200 to the selected memory device among the semiconductor memory devices SMD11 to SMDk4 under the control of the processor 1100 to command to write the program data.

The memory controller 1400 may temporarily store the program data in a page buffer unit of a semiconductor memory device connected to another channel (i.e., a channel other than the channel corresponding to the semiconductor memory device) when the writing of the program data in the corresponding semiconductor memory device is failed. Then, when the physical block address is re-generated by the processor 1100, the memory controller 1400 collects the temporarily stored program data, and writes the collected program data in a semiconductor memory device corresponding to the re-generated physical block address.

Figure 3:
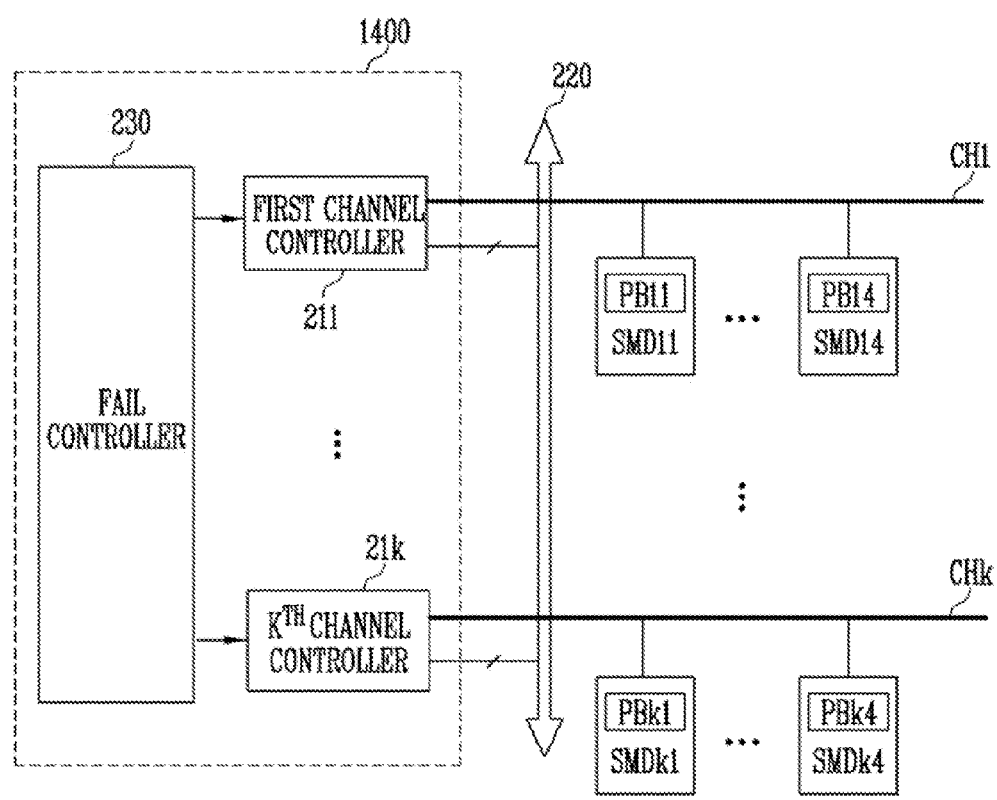
FIG. 3 is a detailed diagram of a memory controller shown in FIG. 1.

FIG. 3 is a detailed diagram of the memory controller 1400 shown in FIG. 1. For the purpose of description, the semiconductor memory devices SMD11 to SMDk4 are illustrated together with the memory controller 1400.

Referring to FIG. 3, the memory controller 1400 may include first to k$^{th}$ channel controllers 211 to 21k and a fail controller 230.

The first to k$^{th}$ channel controllers 211 to 21k are connected to the first to k$^{th}$ channels CH1 to CHk, respectively. The first to k$^{th}$ channel controllers 211 to 21k may communicate with the buffer memory 1200 (see FIG. 1) through the main bus 1500. Each of the first to k$^{th}$ channel controllers 211 to 21k transmits the write command, the physical block address, and the program data stored in the buffer memory 1200 to the selected semiconductor memory device through the corresponding channel in response to the control of the processor 1100. Further, each channel controller notifies the fail controller 230 and the processor 1100 (see FIG. 1) that the writing of the program data according to the state signal SF is received through the corresponding channel.

According to an embodiment, a direct bus 220 is provided. The direct bus 220 may connect the first to k$^{th}$ channel controllers 211 to 21k with each other. For example, the direct bus 220 may be defined with a plurality of lines for connecting the first to k$^{th}$ channel controllers 211 to 21k with each other.

The first to k$^{th}$ channel controllers 211 to 21k may communicate the program data through the direct bus 220 under the control of the fail controller 230.

The fail controller 230 may control the first to k$^{th}$ channel controllers 211 to 21k. The fail controller 230 controls the first to k$^{th}$ channel controllers 211 to 21k so that the first to k$^{th}$ channel controllers 211 to 21k communicate the program data through the direct bus 220 when the writing of the program data is failed.

The fail controller 230 recognizes that the writing of the program data is failed through each channel controller. When the writing of the program data is failed in the semiconductor memory device, the fail controller 230 may control a corresponding channel controller so as to transmit a retrieving command for retrieving the program data left in the page buffer unit of the corresponding semiconductor memory device.

Then, the fail controller 230 selects a semiconductor memory device connected to another channel (i.e., a channel other than the channel corresponding to the semiconductor memory device including the failed writing of the program data), and controls the channel controllers 211 to 21k so that the program data is temporarily stored in the selected semiconductor memory device. The fail controller 230 may control the channel controllers 211 to 21k so that the channel controller of the semiconductor memory device, in which the writing of the program data is failed, transmits the program data to the channel controller of the selected semiconductor memory device. Further, the fail controller 230 may control a channel controller of a selected semiconductor memory device so as to transmit a cache command and the program data for temporarily storing the program data in the page buffer unit of the selected semiconductor memory device. In addition, the fail controller 230 may store information about the selected memory device.

Figure 4:
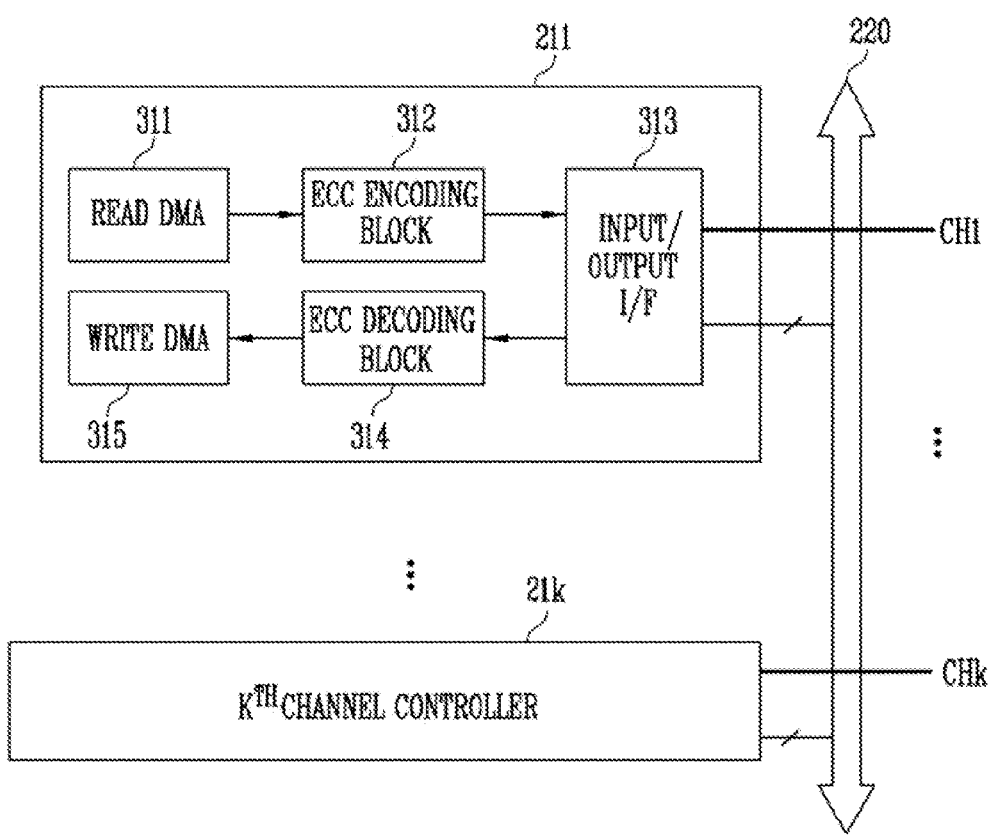
FIG. 4 is a detailed diagram of channel controllers shown in FIG. 3.

FIG. 4 is a detailed diagram of the channel controllers 211 to 21k shown in FIG. 3. FIG. 4 shows a detailed configuration of the first channel controller 211 as an example. It will be understood to those of skill in the art that each of the remaining channel controllers 212 to 21k may be configured in the same manner as that of the first channel controller 211.

Referring to FIG. 4, the first channel controller 211 may include a read direct memory access (DMA) 311, an ECC encoding block 312 using an error correcting code (ECC), an input/output interface 313, an ECC decoding block 314 using an ECC, and a write DMA 315.

The read DMA 311 may read the program data stored in the buffer memory 1200 (see FIG. 1). The read DMA 311 transmits the read program data to the ECC encoding block 312.

The ECC encoding block 312 may generate parity bits by encoding the program data according to an ECC, and generate processed program data by adding the generated parity bits to the program data. The ECC encoding block 312 transmits the processed program data to the input/output interface 313.

Various schemes of ECCs may be used as the ECC. For example, various schemes of ECCs, such as a Bose, Chaudhri, Hocquenghem (BCH) code, a reed solomon code), a Hamming code, a Low Density Parity Check (LDPC) code, may be used as will be understood by those of skill in the art from the disclosure herein.

The input/output interface 313 transmits the program data received from the ECC encoding block 312 to the selected semiconductor memory device through the first channel CH1. In this case, a corresponding write command and a physical block address may be further transmitted.

The input/output interface 313 includes a protocol for communicating with the semiconductor memory devices SMD11 to SMD14 connected to the first channel CH1. For example, the input/output interface 313 includes a NAND interface or a NOR interface.

Further, the input/output interface 313 receives data read from the semiconductor memory devices SMD11 to SMD14 through the first channel CH1.

When the data is received through the input/output interface 313, the ECC decoding block 314 detects and corrects an error included in the data by decoding the corresponding data according to an ECC.

The write DMA 315 may write the data from the ECC decoding block 314 to the buffer memory 1200.

The input/output interface 313 is connected with input/output interfaces of other channel controllers 212 to 21k through the direct bus 220. That is, the channel controllers 211 to 21k may mutually communicate through the direct bus 220.

Figure 5:
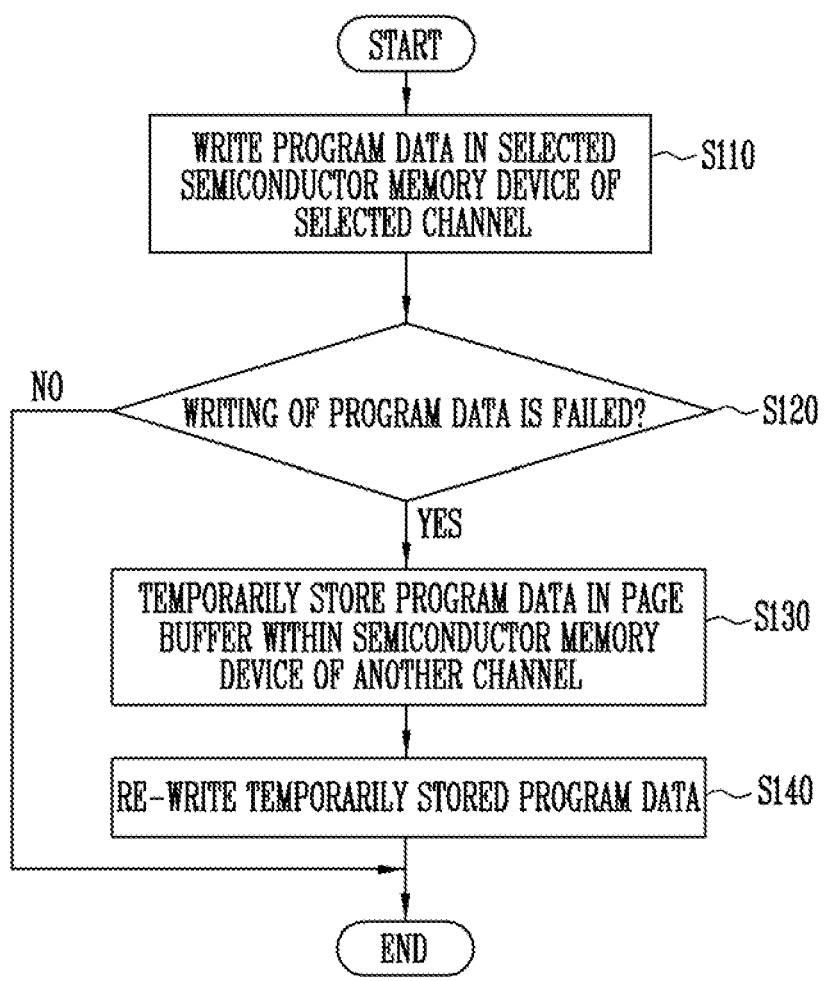
FIG. 5 is a flowchart of an operation of a controller shown in FIG. 1.

FIG. 5 is a flowchart for describing an operation of the controller 1000 shown in FIG. 1.

Referring to FIGS. 1 to 5, at step S110, the controller 1000 writes program data in a selected memory device of a selected channel.

At step S120, the controller 1000 determines whether the writing of the program data is failed. The state signal SF may be received from the semiconductor memory device, in which the writing of the program data is failed. The state signal SF may indicate whether the writing of the program data passed or failed.

At step S130, the controller 1000 temporarily stores the program data in a page buffer unit of a semiconductor memory device connected to another channel. It is assumed that the writing of the program data in a first semiconductor memory device SMD11 connected to the first channel CH1 failed. The controller 1000 may temporarily store the program data in a page buffer unit PBk1 of the semiconductor memory device (e.g., the semiconductor memory device SMDk1) connected to another channel (e.g., the channel CHk). The input/output interface 313 connected to the first channel CH1 may transmit the program data to an input/output interface of another channel through the direct bus 220. The input/output interface of another channel may temporarily store the program data in the page buffer unit of the corresponding semiconductor memory device.

At step S140, the controller 1000 retrieves the temporarily stored program data from the corresponding semiconductor memory device and writes the retrieved program data again.

It is assumed that a function of temporarily storing the program data in the page buffer unit of the semiconductor memory device connected to another channel is not provided when the writing of the program data is failed. In order to write the corresponding program data again, the program data needs to be stored in the buffer memory 1200 again. The program data left in the page buffer unit of the corresponding semiconductor memory device may be transmitted to the write DMA 315 through the corresponding channel CH1, the input/output interface 313, and the ECC decoding block 314. The write DMA may inquire the processor 1100 of the writing of the program data in the buffer memory 1200, and write the program data in the buffer memory 1200 according to a result of the inquiry. The decoding block performs the decoding using an ECC on the program data. The writing of the program data in the buffer memory 1200 by the write DMA indicates that the processor 1100 needs to interrupt an operation currently performed by the processor 1100.

Then, the corresponding program data may be transmitted to the read DMA 311 (see FIG. 4), the ECC encoding block 312 (see FIG. 4), and the input/output interface 313 (see FIG. 4) from the buffer memory 1200, and be written. The passing of the encoding block indicates that decoding using an ECC is performed on the program data.

The series of operations require a relatively long length of time, as well as increase power consumption and a load of the controller 1000. The increase in the number of times of interruption of the operation of the processor 1100 results in an increase of a throughput of the processor 1100.

When the writing of the program data is failed, the controller 1000 temporarily stores the program data in a page buffer unit of a semiconductor memory device connected to another channel. The time and power consumption due to a load for transmitting the program data to the buffer memory 1200 may be decreased. The amount of processing of the processor 1100 may be decreased. Accordingly, there is provided the controller having an improved operation speed, and the memory system including the same.

Figure 6:
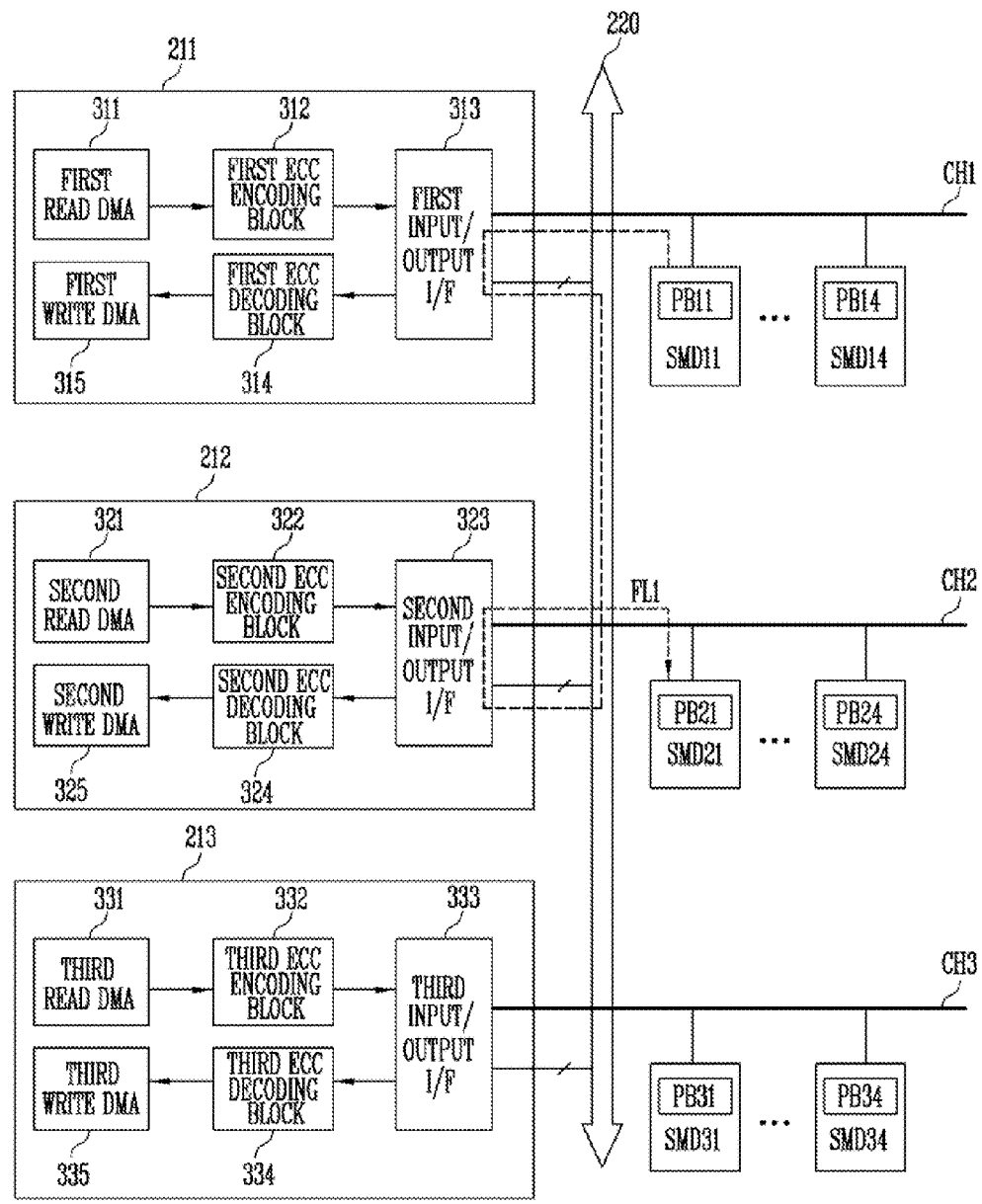
FIGS. 6, 7, and 8 are diagrams describing an operation of the controller shown in FIG. 1
Figure 7:
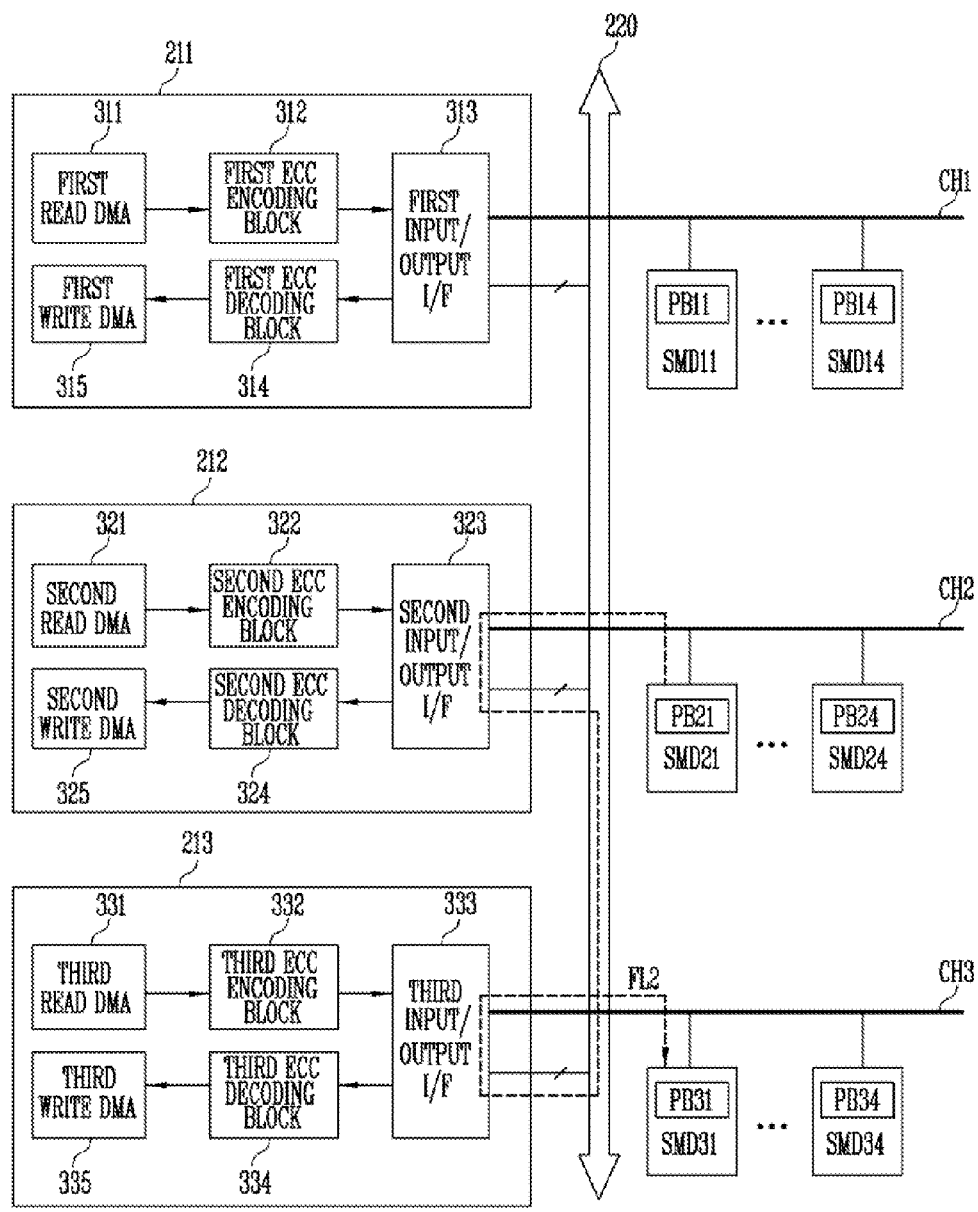
Figure 8:
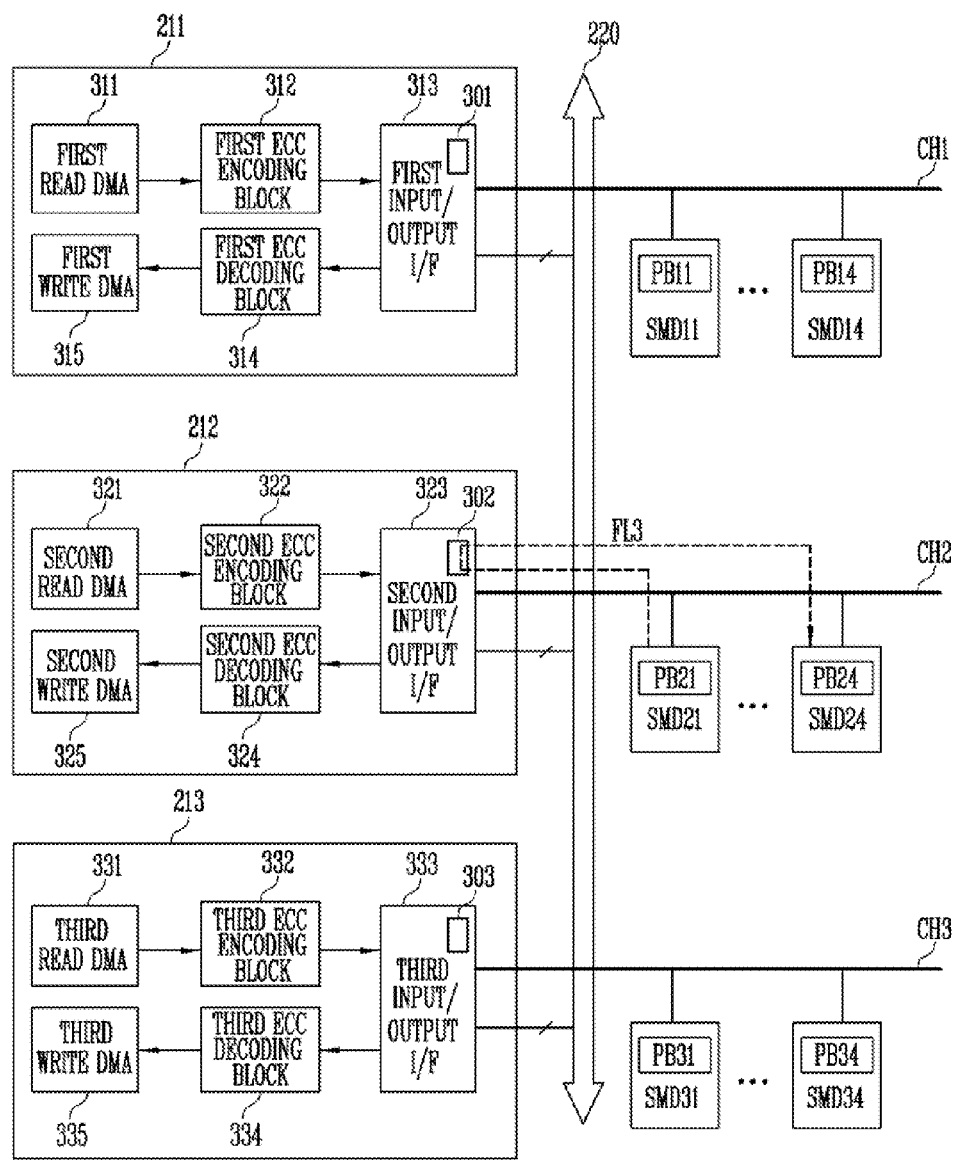

FIGS. 6 to 8 are diagrams for describing an operation of the controller shown in FIG. 1.

FIG. 6 shows a case where program data is temporarily stored when writing of the program data is failed. In FIG. 6, the first to third channel controllers 211 to 213 are illustrated, and the remaining channel controllers 214 to 21*k* are omitted. In FIG. 6, it is assumed that the writing of the program data in the first semiconductor memory device SMD11 connected to the first channel CH1 is failed.

Referring to FIG. 6, the first input/output interface 313 retrieves the program data from the first semiconductor memory device SMD11 through the first channel CH1 under the control of the fail controller 230 (see FIG. 3). For example, the first input/output interface 313 may obtain the program data left in the page buffer unit PB11 of the first semiconductor memory device SMD11 by transmitting a retrieve command to the first semiconductor memory device SMD11.

The fail controller 230 selects a semiconductor memory device connected to one of the remaining channels CH2 to CH*k* except for the first channel CH1. It is assumed that the first semiconductor memory device SMD21 connected to the second channel CH2 is selected. The first input/output interface 313 may transmit the program data to the second input/output interface 323 through the direct bus 220 under the control of the fail controller 230. The second input/output interface 323 may temporarily store the program data in the page buffer unit PB21 of the first semiconductor memory device SMD21 connected to the second channel CH2 under the control of the fail controller 230.

That is, when the writing of the program data is failed, the program data retrieved in the first input/output interface 313 from the first semiconductor memory device SMD11 is temporarily stored in the page buffer unit PB21 of the first semiconductor memory device SMD21 through the direct bus 220, the second input/output interface 323, and the second channel CH2 (see FL1).

FIG. 7 shows a case where the temporarily stored program data is re-written.

Referring to FIG. 7, a semiconductor memory device connected to another channel (i.e., a channel other than the second channel CH2 corresponding to the semiconductor memory device SMD21 temporarily storing the program data for re-writing) may be selected. In the description with reference to FIG. 7, it is assumed that the first semiconductor memory device SMD31 connected to the third channel CH3 is selected. The processor 1100 may generate a physical block address indicating the first semiconductor memory device SMD31 connected to the third channel CH3 when the writing of the program data is failed. The fail controller 230 (see FIG. 3) may control the second and third input/output interfaces 323 and 333 so that the program data is written in the first semiconductor memory device SMD31 connected to the third channel CH3 based on the physical block address.

The second input/output interface 323 retrieves the program data from the first semiconductor memory device SMD21 through the second channel CH2 under the control of the fail controller 230. Further, the second input/output interface 323 may transmit the program data to the third input/output interface 333 through the direct bus 220. The third input/output interface 333 may command to write the program data by transmitting the program data to the first semiconductor memory device SMD31 connected to the third channel CH3.

That is, the program data retrieved in the second input/output interface 323 from the first semiconductor memory device SMD21 connected to the second channel CH2 is transmitted to the first semiconductor memory device SMD31 through the direct bus 220, the third input/output interface 333, and the third channel CH3 (see FL2).

FIG. 8 shows a case where the temporarily stored program data is re-written.

Referring to FIG. 8, a semiconductor memory device connected to the same channel as that of the semiconductor memory device SMD21 temporarily storing the program data for re-writing may be selected. In the description with reference to FIG. 8, it is assumed that the fourth semiconductor memory device SMD24 connected to the second channel CH2 is selected. The processor 1100 may generate a physical block address indicating the fourth semiconductor memory device SMD24 connected to the second channel CH2 when the writing of the program data is failed. The fail controller 230 (see FIG. 3) may control the second input/output interfaces 323 so that the program data is written in the fourth semiconductor memory device SMD24 connected to the second channel CH2 based on the physical block address.

The fourth semiconductor memory device SMD24 is connected to the same channel CH2 as that of the first semiconductor memory device SMD21. A data buffer for a data flow, in which the program data is retrieved through the second channel CH2 and a data flow, in which the program data is provided to the fourth semiconductor memory device SMD24 through the second channel CH2, is required. The input/output interfaces 313 to 333 include data buffers 301 to 303, respectively. Each of the data buffers 301 to 303 may include a shift register.

The second input/output interface 323 retrieves the program data from the first semiconductor memory device SMD21 through the second channel CH2 under the control of the fail controller 230. The retrieved program data is buffered in the data buffer 302. Further, the second input/output interface 323 may command to write the program data by transmitting the buffered program data to the fourth semiconductor memory device SMD24 through the second channel CH2 (see FL3).

Figure 9:
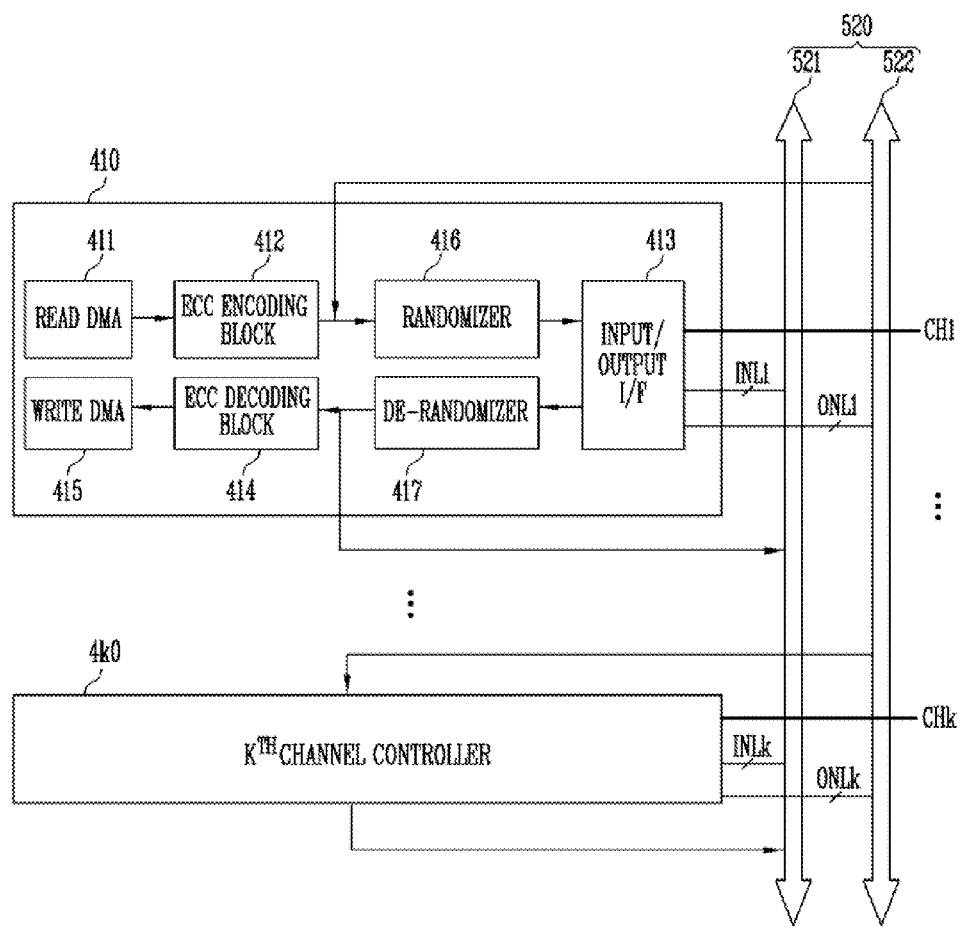
FIG. 9 is a diagram of channel controllers and a direct bus.

FIG. 9 shows another example of detailed configuration of channel controllers 420 to 4k0 and a direct bus 520. FIG. 9 merely shows a detailed configuration of the first channel controller 410. It is understood that each of the remaining channel controllers 420 to 4k0 are configured in the same manner as that of the first channel controller 410.

Referring to FIG. 9, two sub-direct buses 521 and 522 are provided. The sub-direct buses 521 and 522 configure the direct bus 520. The sub-direct buses 521 and 522 connect the first to kth channel controllers 410 to 4k0 with each other.

The first channel controller 410 may include a read DMA 411, an ECC encoding block 412, an input/output interface (I/F) 413, an ECC decoding block 414, a write DMA 415, a randomizer 416, and a de-randomizer 417.

The input/output interface 413 is connected to a first sub-direct bus 522 through input lines INL1. The input/output interface 413 is connected to a second sub-direct bus 521 through output lines ONL1.

The randomizer 416 is connected between the ECC encoding block 412 and the input/output interface 413. The randomizer 416 receives data from the ECC encoding block 412. The randomizer 416 randomizes the received data. Data input into the randomizer 416 may be defined as raw data. The randomized data may be defined as random data. The input/output interface 413 may receive the random data. The input/output interface 413 may communicate the random data with the channel CH1.

It is well known that the semiconductor memory device stores the random data, so that a threshold voltage distribution of the memory cells included in the semiconductor memory device is improved and thus reliability of the semiconductor memory device is improved.

The randomizer 416 may generate the random data by calculating a randomizing seed and the raw data. The randomizing seed may be different for each semiconductor memory device. The randomizing seed may be different for each memory block. The randomizing seed may be different for each page.

The randomizer 416 is connected to the second sub-direct bus 522. The randomizer 416 is connected to the input/output interfaces of the channel controllers 410 to 4k0 through the second sub-direct bus 522. The randomizer 416 may receive the raw data from the read DMA 411, and may receive the raw data through the second sub-direct bus 522.

The de-randomizer 417 is connected between the input/output interface 413 and the ECC decoding block 414. The de-randomize 417 receives the random data through the input/output interface 413. The de-randomizer 417 may generate the raw data by de-randomizing the random data. The generated raw data is transmitted to the write DMA 415. The raw data transmitted to the write DMA 415 may be provided to the buffer memory 1200 (see FIG. 1).

The de-randomizer 417 may share the randomizing seed with the randomizer 416 of the same channel controller 410. The random data generated by the randomizer 416 of the first channel controller 410 may be de-randomized by the de-randomizer 417 of the first channel controller 410.

The randomizer 416 is connected to the first sub-direct bus 521. The randomizer 417 is connected to the input/output interfaces of the channel controllers 410 to 4k0 through the first sub-direct bus 521. The raw data output from the de-randomizer 416 may be transmitted to the ECC decoding block 414, and also be transmitted through the first sub-direct bus 521.

As an embodiment different from that of FIG. 9, the randomizer 416 may be connected between the read DMA 411 and the ECC encoding block 412, and the de-randomizer 417 may be connected between the ECC decoding block 414 and the write DMA 415.

Figure 10:
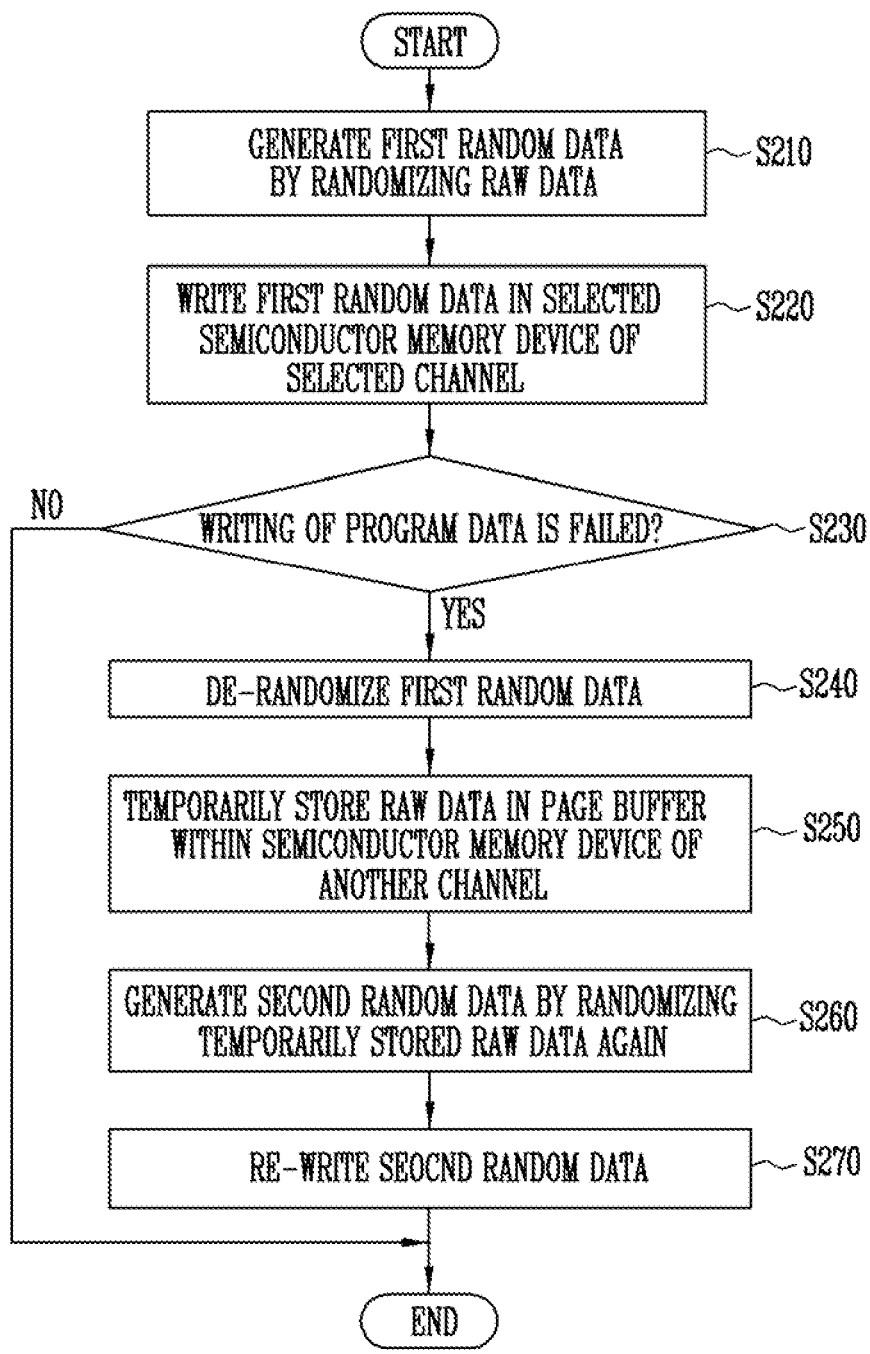
FIG. 10 is a flowchart illustrating an operation of the controller shown in FIG. 1.

FIG. 10 is a flowchart for describing an operation of the controller 1000 shown in FIG. 1.

Referring to FIGS. 1 and 10, at step S210, the controller 1000 generates first random data by randomizing raw data. At step S220, the controller 1000 writes the first random data in a selected semiconductor memory device of a selected channel.

At step S230, the controller 1000 determines whether the writing of the first random data is failed. If not, the controller 1000 may de-randomize the first random data at step S240. The de-randomized data may correspond to raw data. Next, at step S250, the controller 1000 temporarily stores the raw data in a page buffer unit of a semiconductor memory device connected to another channel. That is, the raw data is not loaded to the buffer memory 1200 again, and is temporarily stored in the page buffer unit of the semiconductor memory device connected to another channel.

At step S260, the controller 1000 generates second random data by randomizing the temporarily stored raw data again. The randomizing of the raw data may be performed by the channel controller corresponding to the semiconductor memory device, in which the writing of the raw data is commanded. Then, at step S270, the controller 1000 writes the second random data again.

Figure 11:
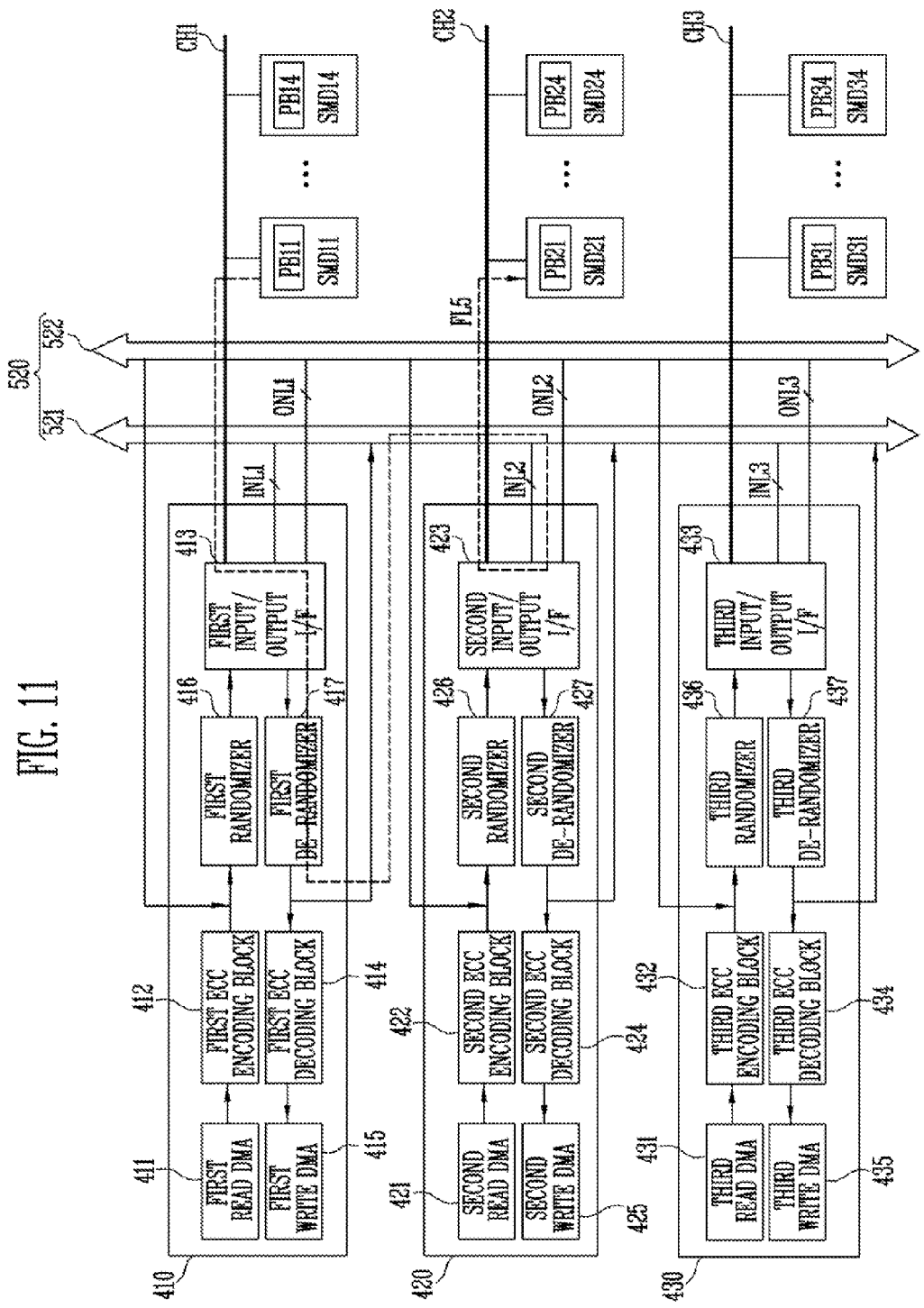
FIGS. 11, 12, and 13 are diagrams depicting an operation of the controller shown in FIG. 1.
Figure 12:
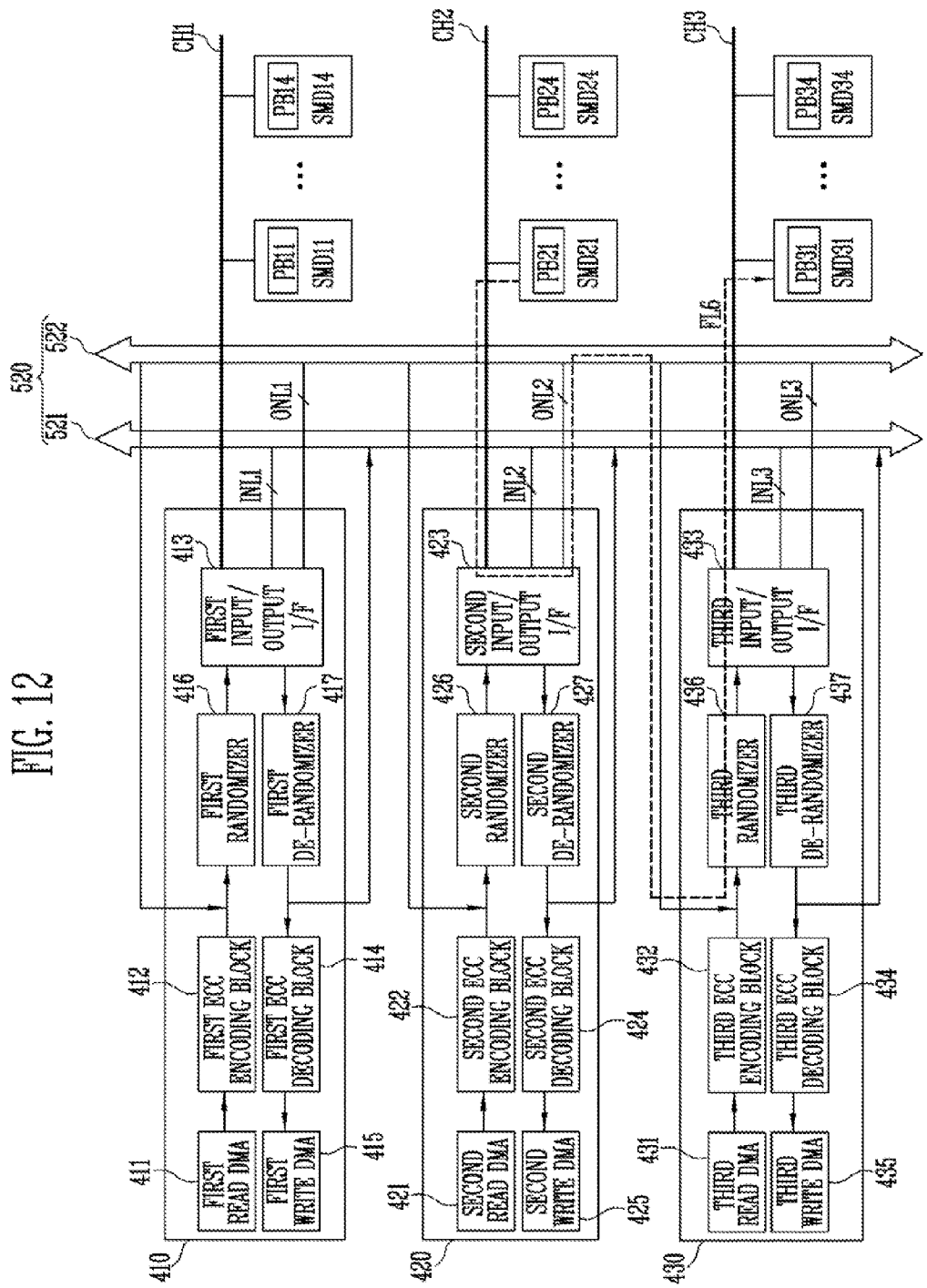
Figure 13:
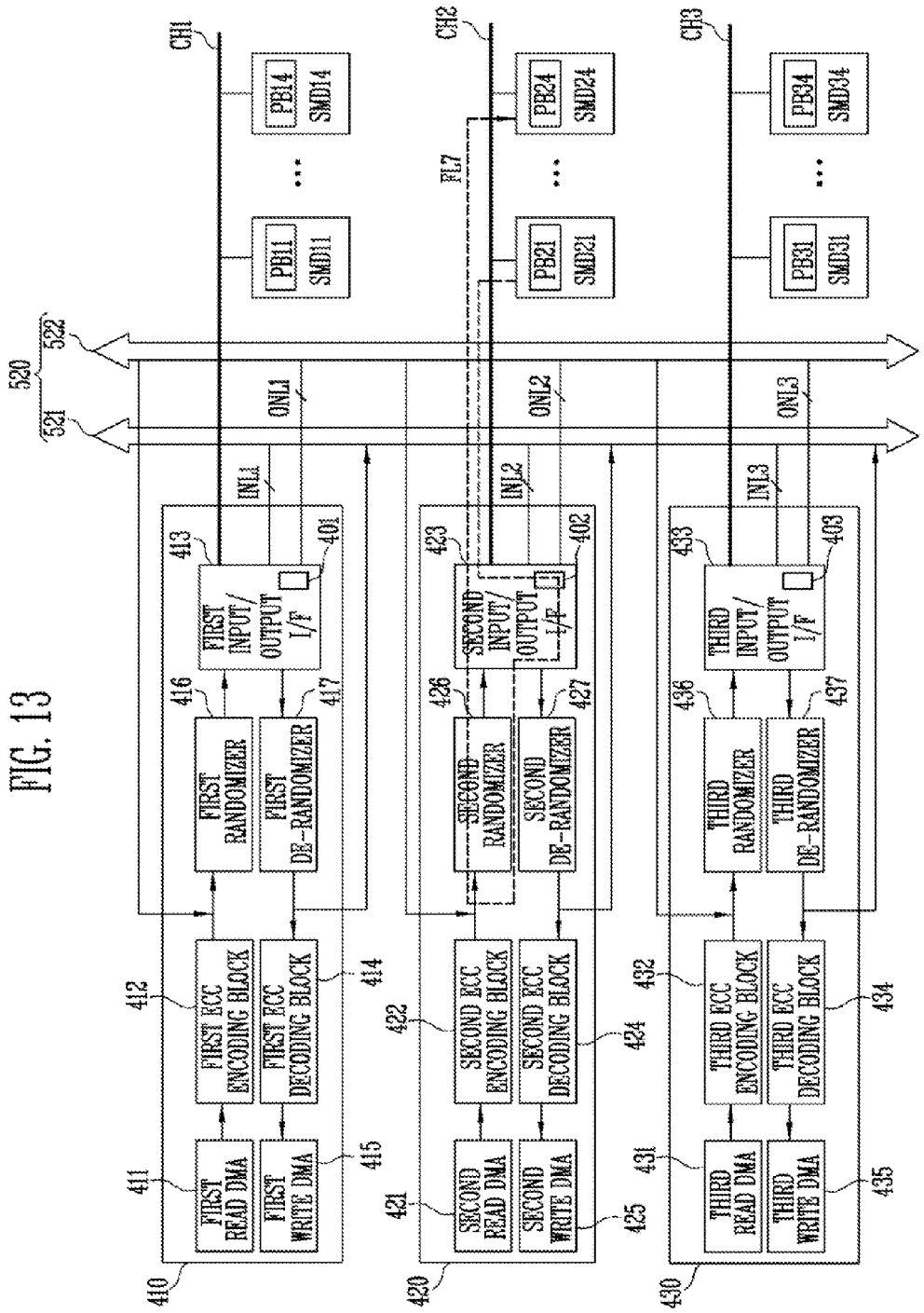

FIGS. 11 to 13 are diagrams for describing an operation of the controller shown in FIG. 1.

FIG. 11 shows a case where raw data is temporarily stored when writing of the program data is failed. In FIG. 11, the first to third channel controllers 410 to 430 are illustrated, and the remaining channel controllers 440 to 4k0 are omitted. In FIG. 11, it is assumed that the writing of the random data in the first semiconductor memory device SMD11 connected to the first channel CH1 is failed.

Referring to FIG. 11, the first input/output interface 413 retrieves the random data from the first semiconductor memory device SMD11 through the first channel CH1, and transmits the retrieved random data to the first de-randomizer 417. The first de-randomizer 417 generates the raw data by de-randomizing the random data, and transmits the generated raw data through the first sub-direct bus 521.

The second input/output interface 423 may obtain the raw data through the first sub-direct bus 521 and the second input lines INL2, and temporarily store the raw data in the page buffer unit PB21 of the first semiconductor memory device SMD21 through the second channel CH2.

That is, the random data retrieved in the first input/output interface 413 from the first semiconductor memory device SMD11 is transmitted to the first de-randomizer 417, and the raw data generated by the first de-randomizer 417 is transmitted to the page buffer unit PB21 of the first semiconductor memory device SMD21 through the first sub-direct bus 521, the second input/output interface 423, and the second channel CH2 (see FL5).

FIG. 12 shows a case where the temporarily stored raw data is re-written.

Referring to FIG. 12, a semiconductor memory device connected to another channel (i.e., a channel other than the second channel CH2 corresponding to the semiconductor memory device SMD21 temporarily storing the raw data during the re-writing) may be selected. In the description with reference to FIG. 12, it is assumed that the first semiconductor memory device SMD31 connected to the third channel CH3 is selected.

The second input/output interface 423 retrieves the raw data from the page buffer unit PB21 of the first semiconductor memory device SMD21 through the second channel CH2, and transmits the retrieved raw data to the second sub-direct bus 522 through the second output lines ONL2. A third randomizer 436 obtains the raw data through the second sub-direct bus 522, and generates random data by randomizing the raw data. The third input/output interface 433 may command to write the random data by transmitting the random data to the first semiconductor memory device SMD31 connected to the third channel CH3.

That is, the raw data retrieved in the second input/output interface 423 from the first semiconductor memory device SMD21 is transmitted to the third randomizer 436 through the second output lines ONL2 and the second sub-direct bus 522, and the random data generated by the third randomizer 436 is transmitted to the first semiconductor memory device SMD31 through the third input/output interface 433 and the third channel CH3 (see FL6).

FIG. 13 shows a case where the temporarily stored program data is re-written.

Referring to FIG. 13, a semiconductor memory device connected to the same channel as that of the semiconductor memory device SMD21 temporarily storing the raw data for re-writing may be selected. In the description with reference to FIG. 13, it is assumed that the fourth semiconductor memory device SMD24 connected to the second channel CH2 is selected.

The fourth semiconductor memory device SMD24 shares the same channel CH2 with the first semiconductor memory device SMD21. A data buffer for a data flow, in which the program data is retrieved through the second channel CH2 and a data flow, in which the program data is provided to the fourth semiconductor memory device SMD24 through the second channel CH2, may be required. The input/output buffers 413 to 433 include data buffers 401 to 403, respectively. Each of the data buffers 401 to 403 may include a shift register connected between a corresponding input/output interface and a corresponding randomizer.

The second input/output interface 423 retrieves the raw data from the page buffer unit PB21 of the first semiconductor memory device SMD21 through the second channel CH2, and buffers the retrieved raw data in the data buffer 402. The second randomizer 426 may generate random data by obtaining and randomizing the buffered raw data. The second input/output interface 423 may command to write the random data by transmitting the random data to the fourth semiconductor memory device SMD24 connected to the second channel CH2.

The second input/output interface 423 may retrieve the raw data from the page buffer unit PB21 of the first semiconductor memory device SMD21 through the second channel CH2, and the second randomizer 426 may generate random data by randomizing the retrieved raw data. The generated random data is buffered in the data buffer 402. The second input/output interface 423 may command to write the random data by transmitting the buffered random data to the fourth semiconductor memory device SMD24 connected to the second channel CH2.

According to the embodiments of the present disclosure, corresponding data is temporarily stored in a page buffer unit of a semiconductor memory device connected to another channel (i.e., a channel other than the channel corresponding to the semiconductor memory device including the failed writing of data. When the writing of the data is failed, the time and power consumption due to a load for transmitting the corresponding data to a buffer memory may be decreased. Accordingly, there is provided a controller having an improved operation speed, and the memory system including the same.

As described above, the embodiment has been disclosed in the drawings and the specification. The specific terms used herein are for purposes of illustration, and do not limit the scope of the present disclosure defined in the claims. Accordingly, those skilled in the art will appreciate that various modifications and another equivalent example may be made without departing from the scope and spirit of the present disclosure. Therefore, the sole technical protection scope of the present disclosure will be defined by the technical spirit of the accompanying claims.

What is claimed is:

1. A memory system, comprising:
   a plurality of channels;
   a plurality of semiconductor memory devices connected to the channels; and
   a controller that controls the semiconductor memory devices through the channels, and generates random data by randomizing raw data,
   wherein the controller writes the random data in a first semiconductor memory device of the plurality of semiconductor memory devices connected to a first channel, and
   wherein, when the writing of the random data has failed, the controller generates the raw data by de-randomizing the random data, and the raw data generated by de-randomizing the random data is temporarily stored in a page buffer unit of a second semiconductor memory device of the plurality of semiconductor memory devices connected to a second channel other than the first channel.

2. The memory system of claim 1, wherein the controller retrieves the raw data generated by de-randomizing the random data from the page buffer unit of the second semiconductor memory device, generates second random data by randomizing the raw data generated by de-randomizing the random data, and writes the second random data in one of the semiconductor memory devices.

3. The memory system of claim 1, wherein,
   when the writing of the random data has failed, the controller retrieves the random data from the first semiconductor memory device through the first channel and de-randomizes the random data, and temporarily stores the raw data generated by de-randomizing the random data in the page buffer unit of the second semiconductor memory device through the second channel.

4. The memory system of claim 1, wherein the controller includes:
   channel controllers connected to the channels, respectively; and
   first and second sub-direct buses connecting the channel controllers,
   wherein each of the channel controllers includes an input/output interface connected to a corresponding channel, a randomizer and a de-randomizer connected to the input/output interface, and
   wherein the de-randomizers of the channel controllers are connected to the input/output interfaces of the channel controllers through the first sub-direct bus, and the randomizers of the channel controllers are connected to the input/output interfaces through the second sub-direct bus.

5. The memory system of claim 4, wherein
the input/output interface of the first channel retrieves the random data from the first semiconductor memory device through the first channel when the writing of the random data has failed, and the de-randomizer of the first channel provides the input/output interface of the second channel with the raw data generated by de-randomizing the random data retrieved from the first semiconductor memory device through the first sub-direct bus, and
the input/output interface of the second channel temporarily stores the raw data generated by de-randomizing the random data retrieved from the first semiconductor memory device in the page buffer unit of the second semiconductor memory device through the second channel.

6. The memory system of claim 5, wherein the input/output interface of the second channel retrieves the raw data generated by de-randomizing the random data, retrieved from the first semiconductor memory device, from the page buffer unit of the second semiconductor memory device through the second channel, and provides a randomizer of a selected channel among the remaining channels except for the second channel with the raw data generated by de-randomizing the random data retrieved from the first semiconductor memory device through the second sub-direct bus, and
the randomizer of the selected channel generates second random data by randomizing the raw data generated by de-randomizing the random data retrieved from the first semiconductor memory device, and the input/output interface of the selected channel writes the second random data in a selected semiconductor memory device among the semiconductor memory devices connected to a corresponding channel.

7. The memory system of claim 5, wherein the input/output interface of the second channel includes a data buffer,
the input/output interface of the second channel retrieves the raw data generated by de-randomizing the random data retrieved from the first semiconductor memory device, from the page buffer unit of the second semiconductor memory device through the second channel,
the randomizer of the second channel generates second random data by randomizing the raw data generated by de-randomizing the random data retrieved from the first semiconductor memory device,
the input/output interface of the second channel writes the second random data in a selected semiconductor memory device among the semiconductor memory devices connected to the second channel, and
the data buffer buffers data communicated through the second channel.

8. A memory system, comprising:
a plurality of channels;
a plurality of semiconductor memory devices connected to the channels; and
a controller that controls the semiconductor memory devices through the channels,
wherein the controller includes channel controllers connected to the channels, respectively, and a direct bus connecting the channel controllers with each other, and
wherein a first channel controller among the channel controllers commands to write random data generated by randomizing raw data in semiconductor memory devices connected to a corresponding channel, generates the raw data by de-randomizing the random data and communicates with a second channel controller among the channel controllers through the direct bus in relation to the raw data generated by de-randomizing the random data when the writing of the random data has failed.

9. The memory system of claim 8, wherein the first channel controller transmits the raw data generated by de-randomizing the random data to the second channel controller through the direct bus when the writing of the random data has failed.

10. The memory system of claim 9, wherein another channel controller temporarily stores the raw data generated by de-randomizing the random data in a page buffer unit of one of the semiconductor memory devices connected to a corresponding channel.

11. The memory system of claim 9, wherein the second channel controller temporarily stores the raw data generated by de-randomizing the random data in a page buffer unit of one of the semiconductor memory devices connected to a corresponding channel.

12. The memory system of claim 8, wherein the controller includes:
a processor that performs a function of a flash translation layer (FTL); and
a fail controller that controls the channel controllers under a control of the processor when the writing of the random data has failed.

13. A method of operating a memory system, comprising:
generating random data by randomizing raw data;
writing the random data in a first semiconductor memory device among the plurality of semiconductor memory devices;
generating, when the writing of the random data has failed, the raw data by de-randomizing the random data retrieved from the first semiconductor memory device connected to a first channel; and
temporarily storing the raw data generated by de-randomizing the random data in a page buffer unit of a second semiconductor memory device among the plurality of semiconductor memory devices connected to a second channel other than the first channel.

14. The method of claim 13, further comprising:
retrieving the raw data from the page buffer unit of the second semiconductor memory device; and
generating second random data by randomizing the raw data generated by de-randomizing the random data; and
writing the second random data in one of the semiconductor memory devices.

15. The method of claim 13, wherein the memory system includes a controller, and
wherein the controller includes:
channel controllers connected to the channels, respectively; and
first and second sub-direct buses connecting the channel controllers,
wherein each of the channel controllers includes an input/output interface connected to a corresponding channel, a randomizer and a de-randomizer connected to the input/output interface, and
wherein the de-randomizers of the channel controllers are connected to the input/output interfaces of the channel controllers through the first sub-direct bus, and the randomizers of the channel controllers are connected to the input/output interfaces through the second sub-direct bus.

16. The method of claim 15, wherein
the input/output interface of the first channel retrieves the random data from the first semiconductor memory device through the first channel when the writing of the random data has failed, and the de-randomizer of the first channel provides the input/output interface of the second channel with the raw data generated by de-randomizing the random data retrieved from the first semiconductor memory device through the first sub-direct bus, and the input/output interface of the second channel temporarily stores the raw data generated by de-randomizing the random data, retrieved from the first semiconductor memory device, in the page buffer unit of the second semiconductor memory device through the second channel.

17. The method of claim 16, wherein the input/output interface of the second channel retrieves the raw data, generated by de-randomizing the random data retrieved from the first semiconductor memory device, from the page buffer unit of the second semiconductor memory device through the second channel, and provides a randomizer of a selected channel among the remaining channels except for the second channel with the raw data generated by de-randomizing the random data retrieved from the first semiconductor memory device through the second sub-direct bus, and the randomizer of the selected channel generates second random data by randomizing the raw data generated by de-randomizing the random data retrieved from the first semiconductor memory device, and the input/output interface of the selected channel writes the second random data in a selected semiconductor memory device among the semiconductor memory devices connected to a corresponding channel.

18. The method of claim 16, wherein the input/output interface of the second channel includes a data buffer, the input/output interface of the second channel retrieves the raw data generated by de-randomizing the random data, retrieved from the first semiconductor memory device, from the page buffer unit of the second semiconductor memory device through the second channel, the randomizer of the second channel generates second random data by randomizing the raw data generated by de-randomizing the random data retrieved from the first semiconductor memory device, the input/output interface of the second channel writes the second random data in a selected semiconductor memory device among the semiconductor memory devices connected to the second channel, and the data buffer buffers data communicated through the second channel.

* * * * *